(12) United States Patent
Chen et al.

(10) Patent No.: US 12,740,297 B2
(45) Date of Patent: Sep. 15, 2026

(54) DISPLAY SCREEN, METHOD AND DEVICE OF DESIGNING SAME, AND STORAGE MEDIUM

(71) Applicant: SHENZHEN METALENX TECHNOLOGY CO.,LTD, Shenzhen (CN)

(72) Inventors: Jianfa Chen, Shenzhen (CN); Chenglong Hao, Shenzhen (CN); Fengze Tan, Shenzhen (CN); Jian Zhu, Shenzhen (CN)

(73) Assignee: SHENZHEN METALENX TECHNOLOGY CO.,LTD, Shenzhen (CN)

( * ) Notice: Subject to any disclaimer, the term of this patent is extended or adjusted under 35 U.S.C. 154(b) by 446 days.

(21) Appl. No.: 18/537,609

(22) Filed: Dec. 12, 2023

(65) Prior Publication Data

US 2024/0206295 A1 Jun. 20, 2024

(30) Foreign Application Priority Data

Dec. 15, 2022 (CN) ......................... 202211620000.2

(51) Int. Cl.

| | |
|---|---|
| ***H10K 59/35*** | (2023.01) |
| ***H10K 50/15*** | (2023.01) |
| ***H10K 50/16*** | (2023.01) |
| ***H10K 59/12*** | (2023.01) |
| ***H10K 59/80*** | (2023.01) |
| *H10K 102/10* | (2023.01) |
| *H10K 102/20* | (2023.01) |

(52) U.S. Cl.
CPC ......... *H10K 59/879* (2023.02); *H10K 50/157* (2023.02); *H10K 50/167* (2023.02); *H10K 59/1201* (2023.02); *H10K 59/353* (2023.02); *H10K 2102/103* (2023.02); *H10K 2102/20* (2023.02)

(58) Field of Classification Search
None
See application file for complete search history.

(56) References Cited

U.S. PATENT DOCUMENTS

2021/0272302 A1* 9/2021 Yang ...................... G01B 11/22
2022/0191362 A1* 6/2022 Li ...................... G02B 27/4205
2022/0376209 A1* 11/2022 Tian ..................... H10K 59/121

FOREIGN PATENT DOCUMENTS

CN 218297070 U * 1/2023

* cited by examiner

*Primary Examiner* — Evan G Clinton
(74) *Attorney, Agent, or Firm* — JCIPRNET

(57) ABSTRACT

A display screen, a method and a device for designing the display screen, and a storage medium are provided. The display screen includes pixels periodically arranged, each pixel includes at least one sub-pixel. Each sub-pixel includes a basic structure and at least one micro or nano sized structure. The basic structure emits imaging light with color for display. The micro or nano sized structure is provided on a back-lighting side of the basic structure, and is configured to project incident light into speckles and enable the speckles to pass through the basic structure. A refractive index of the basic structure is different from a refractive index of the micro or nano sized structure.

17 Claims, 8 Drawing Sheets

DISPLAY SCREEN, METHOD AND DEVICE OF DESIGNING SAME, AND STORAGE MEDIUM

CROSS-REFERENCE TO RELATED APPLICATIONS

This application claims the benefit of priority from Chinese Patent Application No. 202211620000.2, filed on Dec. 15, 2022. The content of the aforementioned application, including any intervening amendments thereto, is incorporated herein by reference in its entirety.

FIELD

The present disclosure relates to the field of generation of structured light, in particular to a display screen, a method and a device of designing the display screen, and a storage medium.

BACKGROUND

The configuration of full-screen of electronic devices gradually becomes more important with the increase in requirements of display and touch-operated controls for full screen. As for increasing screen area ratio, which means a screen gradually covers an entire display area without typical window-framing interface, an assembly of an optical transceiver (including diffractive optical elements) for facial recognition and a front lens are inevitable problems.

The current solution is to set the optical transceiver on a back-lighting side of the display screen, that is, the optical transceiver is below the display screen. The display screen above the optical transceiver displays images normally, and light (such as structured light) emitted or received by the optical transceiver passes through the display screen. However, one problem is that the display screen itself has a low transmittance, and another problem is the display screen serve as periodic diffraction structures as the pixel units are regularly arranged in the display screen along horizontal and vertical directions, consequently, diffraction patterns are observed with light emitted or received by the optical transceiver. The mentioned two problems cause poor quality of optical signals emitted or received by the optical transceiver. In addition, the assembly of diffractive optical elements under the display screen hardly meets the demand of lightness and thinness for the electronic devices.

SUMMARY

In view of the above technical problems, a display screen, a method and a device of designing the display screen, and a storage medium are provided according to embodiments of the present disclosure.

In a first aspect of the present disclosure, a display screen is provided. The display screen includes a plurality of pixels periodically arranged. Each pixel includes at least one sub-pixel. Each sub-pixel is configured to display a color. Each sub-pixel includes a basic structure and at least one micro or nano sized structure. The basic structure is configured to emit imaging light with the color for display. The at least one micro or nano sized structure is provided on a back-lighting side of the basic structure, and is configured to project incident light into speckles and enable the speckles to pass through the basic structure. A refractive index of the basic structure is different from a refractive index of the at least one micro or nano sized structure.

In an embodiment, the refractive index of the basic structure is less than the refractive index of the at least one micro or nano sized structure. An absolute value of a difference between the refractive index of the at least one micro or nano sized structure and the refractive index of the basic structure is greater than a preset threshold.

In an embodiment, a material of the at least one micro or nano sized structure includes silicon nitride, fused quartz, gallium nitride, amorphous silicon or crystalline silicon.

In an embodiment, the basic structure includes a metal cathode layer, a hole transport layer, an organic molecule layer, an electron transport layer, a transparent anode layer and a substrate layer which are stacked in sequence. A side of the metal cathode layer away from the hole transport layer is adhered to the at least one micro or nano sized structure.

In an embodiment, the at least one micro or nano sized structure is an antenna, and a material of the at least one micro or nano sized structure includes a noble metal.

In an embodiment, the basic structure includes a hole transport layer, an organic molecule layer, an electron transport layer, a transparent anode layer and a substrate layer which are stacked in sequence. A side of the hole transport layer away from the organic molecule layer is adhered to the at least one micro or nano sized structure.

In an embodiment, the at least one micro or nano sized structure includes a dual-arm structure; the dual-arm structure includes two straight arms connected at a common endpoint, and an included angle is formed by the two straight arms at the common endpoint.

In an embodiment, the included angle is greater than or equal to 60°, and less than or equal to 180°.

In an embodiment, the at least one micro or nano sized structure includes a split ring structure.

In an embodiment, each pixel includes three kinds of sub-pixels configured to display three different colors, and each kind of sub-pixels displays a first color, a second color or a third color.

In a second aspect of the present disclosure, a method of designing the display screen is provided, the method includes: determining a phase distribution of the display screen according to a preset speckle image and a light source function of a light source used for projecting speckles; the preset speckle image is configured to represent a distribution of the speckles to be projected on the display screen; establishing a sub-pixel database by simulation, and the sub-pixel database includes a plurality of sub-pixels in different structural sizes, and each sub-pixel corresponds to a modulation phase; searching the sub-pixel database to obtain selected sub-pixels, and modulation phases of the selected sub-pixels are in accordance with the phase distribution; determining a sub-pixel distribution of the display screen, generating the display screen based on the sub-pixel distribution; the sub-pixel distribution represents structural sizes of the selected sub-pixels at different positions.

In an embodiment, a step of determining the phase distribution of the display screen according to the preset speckle image and the light source function of the light source used for projecting the speckles includes: determining the phase distribution of the display screen by a G-S algorithm or an iterative Fourier transform algorithm.

In an embodiment, in a case that each pixel of the display screen to be designed include three kinds of sub-pixels each displaying a first color, a second color or a third color, a step of establishing the sub-pixel database by the simulation includes: imparting all of a first refractive index of displaying the first color, a second refractive index of displaying the second color and a third refractive index of displaying the third color to organic molecules of the sub-pixels of each structural size; simulating the sub-pixels of each structural size to obtain three different modulation phases and generate the sub-pixel database. The three different modulation phases respectively correspond to the sub-pixels in which the organic molecules respectively have the first refractive index, the second refractive index and the third refractive index.

In an embodiment, in a case that the each pixel of the display screen to be designed include three kinds of sub-pixels each displaying a first color, a second color or a third color, a step of establishing the sub-pixel database by the simulation includes: averaging refractive indices of organic molecules used to display three different colors, so as to obtain an average value; assigning the average value to the refractive indices of the organic molecules of respective sub-pixels; performing simulation to obtain a plurality of modulation phases corresponding to the sub-pixels having organic molecules with a same refractive index, so as to form the sub-pixel database.

In an embodiment, after searching the sub-pixel database to obtain the selected sub-pixels and determining the sub-pixel distribution of the display screen, the method further includes: assigning organic molecules that display different colors to respective kinds of sub-pixels in each pixel.

In a third aspect of the present disclosure, a device for designing a display screen is provided. The device includes a determination module, an establishment module and a generation module. The determination module is configured to determine a phase distribution of the display screen according to a preset speckle image and a light source function of a light source used for projecting speckles; the preset speckle image is configured to represent a distribution of the speckles to be projected on the display screen. The establishment module is configured to establish a sub-pixel database by simulation. The sub-pixel database includes a plurality of sub-pixels in different structural sizes, and each sub-pixel corresponds to a modulation phase. The generation module is configured to search the sub-pixel database to obtain selected sub-pixels, determine a sub-pixel distribution of the display screen, and generate the display screen based on the sub-pixel distribution. modulation phases of the selected sub-pixels are in accordance with the phase distribution. The sub-pixel distribution represents structural sizes of the selected sub-pixels at different positions.

In a fourth aspect of the present disclosure, an electronic device is provided. The electronic device includes a processor and a memory. The memory includes a computer program stored in the memory. The computer program is executed by the processor, so as to implement the method of designing the display screen of the second aspect of the present disclosure.

In a fifth aspect of the present disclosure, a storage medium that is computer-readable is provided. A computer program is stored in the storage medium. The computer program is executed by a processor, so as to implement the method of designing the display screen of the second aspect of the present disclosure.

In the sixth aspect of the present disclosure, a computer program product is provided. The computer program product includes a computer program. The computer program is executed to implement the method of designing the display screen of any one of feasible designs of the second aspect of the present disclosure.

The embodiment of the first aspect of the present disclosure improves the existing pixel unit (i.e., the existing sub-pixel). In the original design, there exists a basic structure with a lower refractive index, and based on that, a micro or nano sized structure with a relatively higher refractive index is used to modulate the phase of the incident light, such that the sub-pixel not only has the original function of emitting imaging light for display, but also has an additional function of projecting speckles. In other words, the display screen itself is a diffractive element. In the present embodiment, a higher screen-to-body ratio is realized, in addition, it is not necessary to consider the interference diffraction caused by the display screen itself, which are inevitable for conventional display screen. Thus, the display screen of the present disclosure outputs light signals with higher quality. In addition, the aforementioned two functions are simultaneously realized by regularly-arranged sub-pixels in the display screen in the present disclosure, without need of the assembly of under-screen diffractive elements, so the required installation space becomes smaller, thereby meeting the increasing demands for lighter and thinner electronic devices.

In the embodiment of the second aspect of the present disclosure, only according to light source function of the selected light source and the preset speckle image, it is directly calculated by an algorithm (such as the G-S algorithm) to obtain the modulation phases of the sub-pixels that are distributed on the surface of the display screen to be designed, such that the phase distribution of the display screen is obtained. In addition, the method provided herein enables the establishment of a sub-pixel database, which associates sub-pixels of different structural sizes with the modulation phases thereof. With the search in the sub-pixel database, appropriate sub-pixels are directly found, and then, the display screen is finally generated. Through the method provided herein, the phase distribution of the display screen is determined more concisely and clearly, and a display screen that projects incident light as speckles and displays images is quickly and accurately generated.

In order to make objects, features and advantages mentioned in the present disclosure more obvious and understandable, preferred embodiments of the disclosure will be given below and described in detail with reference to the accompanying drawings.

BRIEF DESCRIPTION OF THE DRAWINGS

In order to explain embodiments of the present disclosure or the prior art more clearly, drawings used in the description of the embodiments or the prior art will be briefly explained below. Obviously, the following drawings are merely for exemplary and explanatory purposes. It is understood by those skilled in the art that without paying any creative efforts, other drawings are available based on the following drawings.

DETAILED DESCRIPTION OF THE EMBODIMENTS

It should be understood that terms used in the present disclosure, such as "central", "longitudinal", "transverse", "length", "width", "thickness", "upper", "lower", "front", "rear", "left", "right", "vertical", "horizontal", "top", "bottom", "interior", "exterior", "clockwise", "counterclockwise" which are intended to indicate orientational or positional relationships based on the accompanying drawings are only for the purpose of describing the present disclosure conveniently and simply, and are not intended to indicate or imply a particular orientation, a structure and an operation in a particular orientation of the device or element referred to herein, and thus are not to be interpreted as a limitation to the present disclosure.

In addition, terms "first" and "second" are used for descriptive purposes, and are not intended to indicate or imply relative importance or implicitly indicate the quantity of the indicated technical features. Therefore, features defined by "first" or "second" may explicitly or implicitly include one or more of these features. In the description of the present disclosure, "plurality" or "multiple" means that there are two or more of these features, unless otherwise explicitly and specifically defined.

In the present disclosure, unless otherwise clearly stated and defined, terms "assemble", "connect", "joint", "fix" and the like should be understood in a broad sense. For example, these terms may be referred to as "fixedly connect", "detachably connect", or "integrally connected"; these terms may also be referred to as "mechanically connect" or "electrically connect"; these terms may be further referred to as "directly connect", "indirectly connected by an intermediary" or "communicated between an interior of an element and an interior of another element". It is understandable to a person having ordinary skill in the art that the terms set forth are interpreted according to specific scenarios of the present disclosure.

Figure 1:
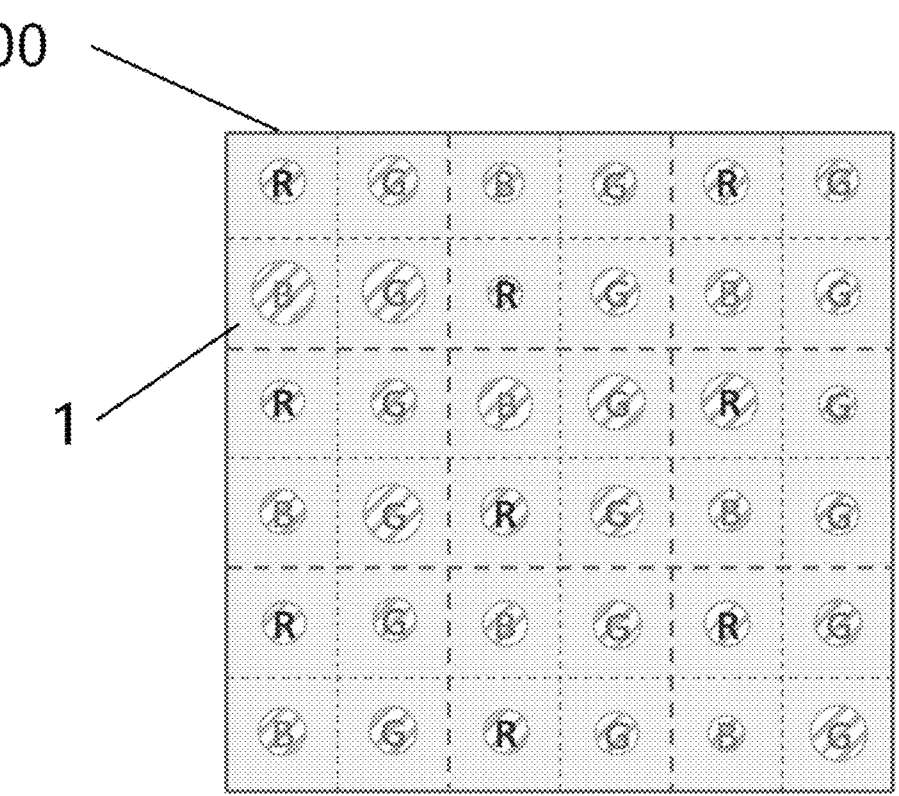
FIG. 1 depicts an arrangement of a display screen according to an embodiment of the present disclosure.

A display screen is provided according to an embodiment of the present disclosure. As shown in FIG. 1, the display screen includes a plurality of pixels 100 periodically arranged. Each pixel includes at least one sub-pixel 1, and each sub-pixel 1 is configured to display a color. Dashed lines of different thicknesses shown in FIG. 1 are used for division of the pixels 100 and sub-pixels 1, for example, the pixels 100 are separated by thick dashed lines and the sub-pixels 1 are separated by thin dashed lines. In FIG. 1, nine pixels 100 are shown, and each pixel 100 includes four sub-pixels 1.

Figure 2:
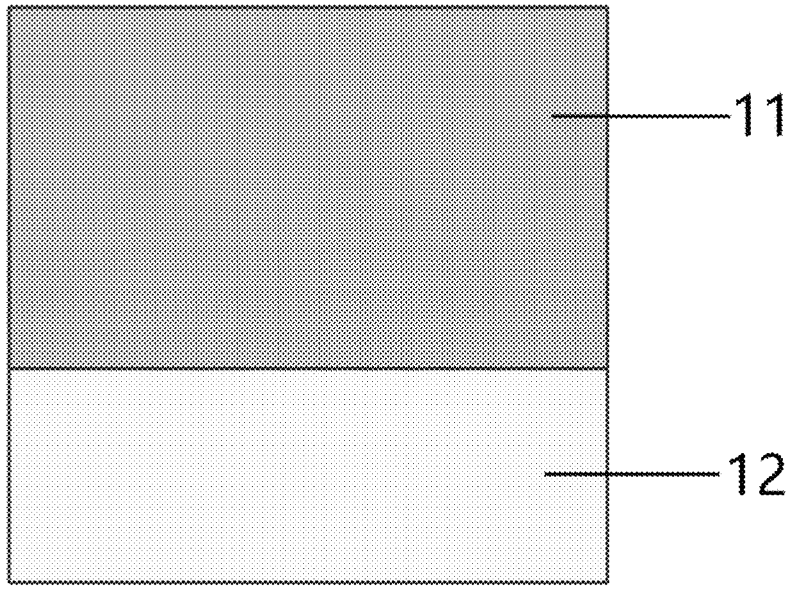
FIG. 2 schematically shows a structural diagram of a sub-pixel in a display screen according to an embodiment of the present disclosure.

Where, each sub-pixel 1 includes a basic structure 11 and at least one micro or nano sized structure 12. FIG. 2 shows a sub-pixel including a micro or nano sized structure 12. Specifically, the basic structure 11 is configured to emit imaging light with the color for display. The micro or nano sized structure 12 is provided on a back-lighting side of the basic structure 11. In FIG. 2, a lower side of the basic structure 11 is a back-lighting side of the basic structure, and the micro or nano sized structure 12 is configured to project incident light into speckles and enable the speckles to pass through the basic structure 11. A refractive index of the basic structure 11 is different from a refractive index of the micro or nano sized structure 12.

In an embodiment, the refractive index of the basic structure 11 is less than the refractive index of the micro or nano sized structure 12, and an absolute value of a difference between the refractive index of the micro or nano sized structure and the refractive index of the basic structure is greater than a preset threshold.

Figure 3:
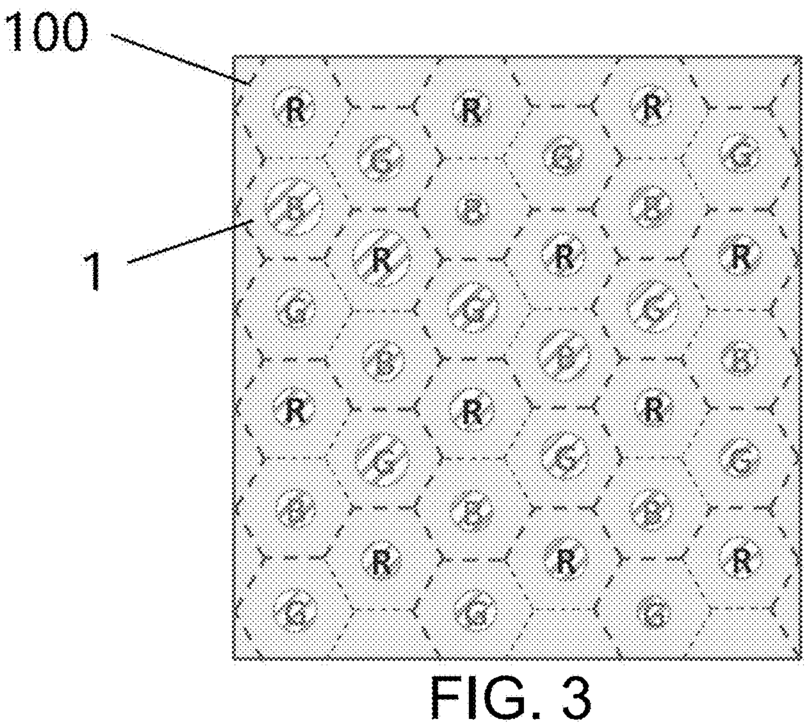
FIG. 3 depicts an arrangement of a display screen according to an embodiment of the present disclosure.

In the present embodiment, each pixel 100 may include one sub-pixel 1 or may include a plurality of sub-pixels 1. As shown in FIG. 1, each pixel 100 includes four sub-pixels 1. Where, a shape of the sub-pixel 1 is not specifically defined in the present embodiment. The sub-pixel 1 may have any shape as long as the arrangement of the sub-pixels 1 makes for the configuration of a display screen. For example, the sub-pixel 1 may be in a close-packed shape, and a center of the close-packed shape is provided with at least one micro or nano sized structure 12. Where, the close-packed shape refers to a shape by which multiple sub-pixels are able to be in a dense arrangement. Common close-packed shapes include a square shape or a hexagonal shape, and a center of each sub-pixel 1 is provided with one micro or nano sized structure 12. Due to the close-packing formed by multiple sub-pixels 1, there is no gaps on a surface of a pixel 100 composed of the sub-pixels 1. As shown in FIG. 1, each sub-pixel 1 is square, and multiple sub-pixels 1 are arranged to form a square array. As shown in FIG. 3, each sub-pixel 1 is orthohexagonal, and multiple sub-pixels 1 are arranged to form an orthohexagonal array. Where, compared with an array formed from other close-packed shapes, an orthohexagonal array is a more dense arrangement with higher packing efficiency, in other words, a ratio of an area of sub-pixels 1 to an area of the display screen is larger, displaying more efficient space utilization. In addition, a more dense arrangement enlarges a range of the modulation of the effective refractive index. It is understandable to those skilled in the art that the sub-pixels 1 in the pixel 100 may be arranged in other array forms. All variations should fall within the scope of the present application.

Where, sub-pixels 1 may display a single color, such as, black or white (gray may also be included), in other words, the display screen is in a state of black and white, which is not illustrated in the accompanying drawings. Or, sub-pixels 1 may display different colors, that is, the display screen is in a state of colors. Optionally, a pixel 100 includes three kinds of sub-pixels 1 displaying three different colors, and each kind of sub-pixels 1 displays one color among a first color, a second color and a third color. For example, the first color may be red (R), the second color may be green (G) and the third color may be blue (B). Herein, R, G, B are exemplary for illustrative purposes, which should not be interpreted as excluding other cases of three colors. Where, there may be multiple sub-pixels 1 displaying the same color, referring to FIG. 1, a pixel 100 includes four sub-pixels 1. Two of the four sub-pixels 1 pertain to the same kind of sub-pixels, that is, the two of the four sub-pixels 1 display the same color (i.e., green).

In an embodiment, each sub-pixel 1 includes a basic structure 11 and a micro or nano sized structure 12. The basic structure 11 includes a light-emitting side and a back-lighting side. As shown in FIG. 2, an upper side of the basic structure 11 is the light-emitting side, and a lower side of the basic structure 11 is the back-lighting side. Where, the basic structure 11 projects a light beam with one or more colors towards the light-emitting side of the basic structure 11. The light beam projected by the basic structure 11 generates the display images. Therefore, the colored light beam projected by the basic structure 11 towards the light-emitting side of the basic structure 11 is called imaging light for display. The micro or nano sized structure 12 and the back-lighting side of the basic structure 11 are adhered to each other. The micro or nano sized structure 12 and the back-lighting side of the basic structure 11 together constitute a sub-pixel 1, and the sub-pixel 1 is configured to project incident light into the speckles. Specifically, the incident light goes into the sub-pixel 1 from a side of the micro or nano sized structure 12 away from the basic structure 11.

In the present disclosure, a refractive index of the micro or nano sized structure 12 is different from a refractive index of the basic structure 11, specifically, the refractive index of the micro or nano sized structure 12 is larger than the refractive index of the basic structure 11, and an absolute value of a difference between the refractive index of the micro or nano sized structure 12 and the refractive index of the basic structure 11 is greater than a preset threshold, for example, the preset threshold may be a value greater than 0.5, more specifically, the preset threshold may be 1, 1.5, 2 or 2.5. That is, the difference between the refractive index of the micro or nano sized structure 12 and the refractive index of the basic structure 11 is large enough so that light incident on the sub-pixel 1 is efficiently modulated by the micro or nano sized structure 12. For instance, if the preset threshold is 1, in the sub-pixel 1, the refractive index of the basic structure 11 is 1.75, the refractive index of the micro or nano sized structure 12 is 3.64, thus the absolute value of the difference between the refractive index of the micro or nano sized structure 12 and the refractive index of the basic structure 11 is equal to 1.89, being greater than the preset threshold of 1. Therefore, the difference between the refractive index of the micro or nano sized structure 12 and the refractive index of the basic structure 11 is large enough so that light incident on the sub-pixel 1 is efficiently modulated into speckles by the micro or nano sized structure 12. The speckles go into the basic structure 11 from the back-lighting side of the basic structure 11 and go out of the basic structure 11 from the light-emitting side of the basic structure 11. Where, a light source for providing the incident light may be a single laser light source or a patterned light source array, for example, the patterned light source array may be a VCSEL (Vertical-Cavity Surface-Emitting Laser) array. It is noted that such feature is provided only for illustration and is not intended to limit the present disclosure.

Figure 4:
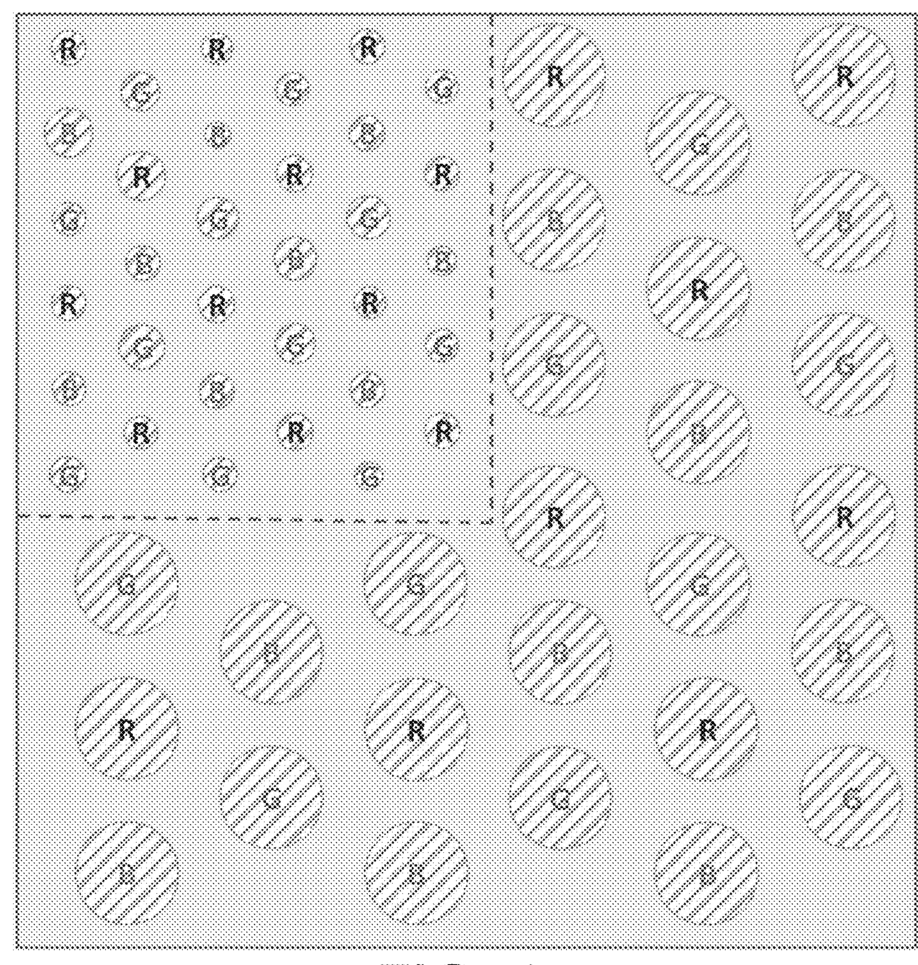
FIG. 4 depicts an arrangement of a display screen according to an embodiment of the present disclosure, and in the display screen, an area with sub-pixels has dual functions, and an area with conventional pixel elements has a single function.

It should be further noted that the sub-pixels 1 provided herein may be combined with conventional pixels which are used for imaging, and such combination constitutes the same display screen. For example, an area with sub-pixels 1 may be located at any position on the display screen, such as, a top of the display screen. In the display screen shown in FIG. 4, an area with the sub-pixels 1 is a dual-function area (i.e., an area in the upper-left corner of FIG. 4), whereas, an area with conventional pixels has a single function of imaging, and thus such area is a single-function area (i.e., an area of the display screen except the upper-left corner of FIG. 4). In the actual manufacturing process, the dual-function area and the single-function area are manufactured at the same time, which greatly reduces the cost and lowers the difficulty of the fabrication of the display screen.

Figure 5:
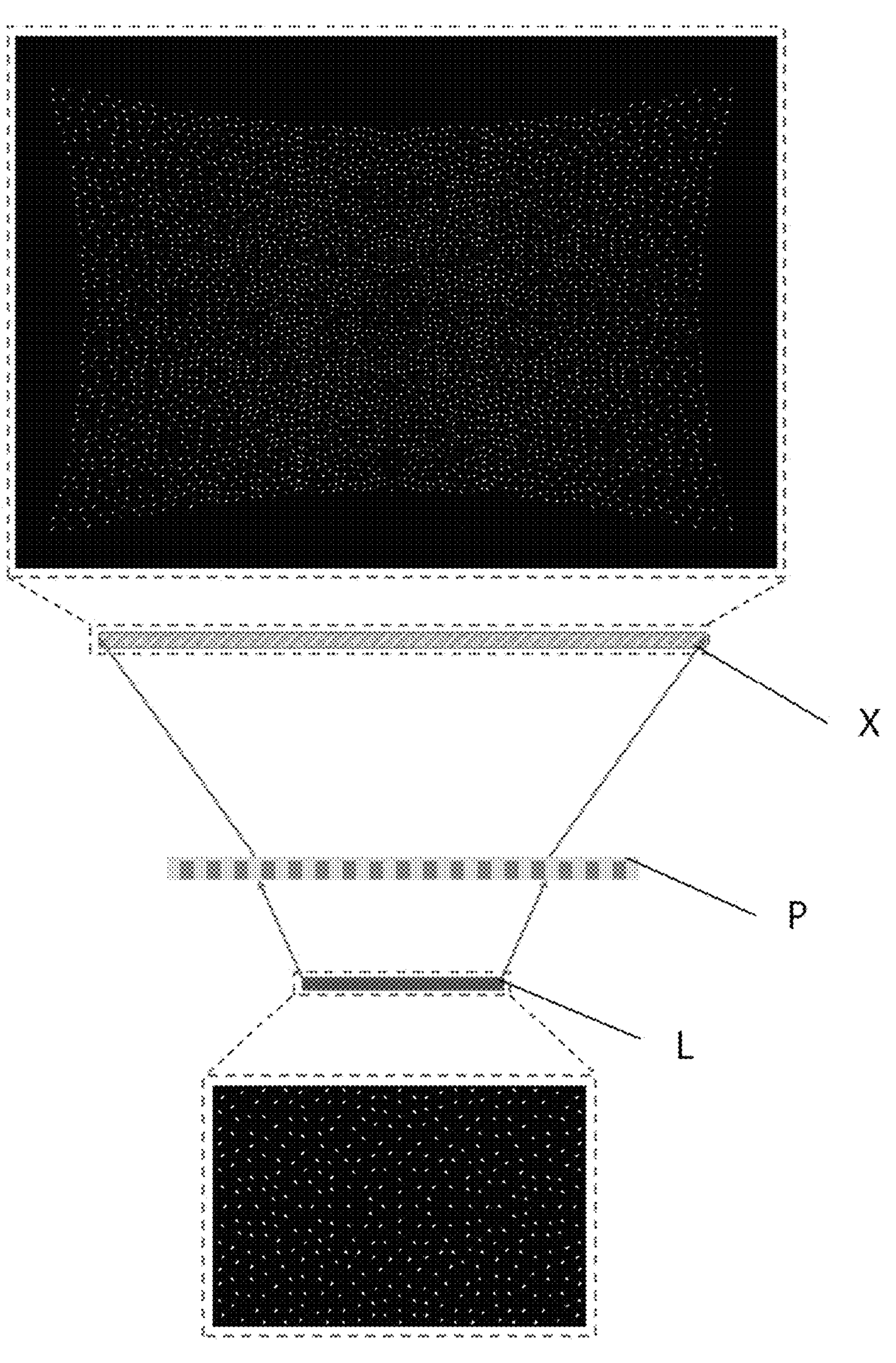
FIG. 5 is a schematic diagram showing use effects of a display screen according to an embodiment of the present disclosure.

In the display screen of the present disclosure, the existing pixel unit (i.e., the existing sub-pixel) is improved. In the original design, there exists a basic structure 11 with a lower refractive index, and based on that, a micro or nano sized structure 12 with a relatively higher refractive index is used to modulate the phase of the incident light, such that the sub-pixel 1 not only has the original function of emitting imaging light for display, but also has an additional function of projecting speckles. In other words, the display screen itself is a diffractive element, as shown in FIG. 5, effects of the display screen in use are illustrated, and in FIG. 5, X represents an area to be measured; P represents the display screen; and L represents a light source. In the present embodiment, a higher screen-to-body ratio is realized, in addition, it is not necessary to consider the interference diffraction caused by the display screen itself, which is inevitable for the conventional display screen. Thus, the display screen of the present disclosure outputs light signal with higher quality. In addition, the two functions mentioned above are realized by the use of the sub-pixels 1 regularly arranged in the display screen in the present disclosure, without the need of the assembly of under-screen diffractive elements, thus, the required installation space becomes smaller, thereby meeting demands of lightness and thinness for the electronic devices.

Optionally, the sub-pixel 1 includes filler materials. The filler materials are used to fill areas around the micro or nano sized structures 12, and the filler materials are transparent or translucent in the operating wavelength range. An absolute value of a difference between a refractive index of the filler materials and a refractive index of the micro or nano sized structure 12 is greater than or equal to 0.5.

In the present embodiment, in the case that a diameter of the micro or nano sized structure 12 is smaller than a diameter of the base structure 11, the filler materials are used to fill areas around the micro or nano sized structures 12, in other words, the filler materials fill empty space of a structural period that are not occupied by the micro or nano sized structures 12, where, a structural period of the micro or nano sized structure 12 corresponds to a size of the sub-pixel 1. For example, in the case that the sub-pixel 1 includes multiple micro or nano sized structures 12, the filler materials fill gaps between the multiple micro or nano sized structures 12. It should be noted that, under the operating wavelength range of the light source being capable of projecting speckles, the sub-pixels 1 in each pixel 100 of the display screen of the present embodiment has a certain transmittance, for example, a transmittance higher than 40%. Thus, under the operating wavelength range of the incident light, the filler materials around the micro or nano sized structure 12 also have a certain transmittance, for example, a transmittance higher than 40%. The filler materials are able to protect the micro or nano sized structure 12, in addition, the absolute value of the difference between the refractive index of the filler materials and the refractive index of the micro or nano sized structure 12 is greater than or equal to 0.5, thereby preventing the filler materials from affecting the modulation to the incident light.

Figure 6:
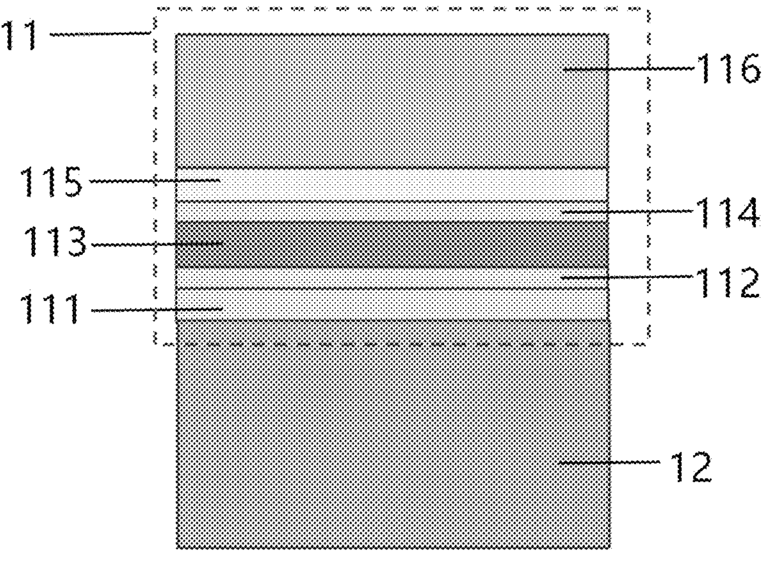
FIG. 6 schematically shows a specific structural diagram of a sub-pixel in a display screen according to an embodiment of the present disclosure.

Optionally, a material of the micro or nano sized structure 12 includes silicon nitride, fused quartz, gallium nitride, amorphous silicon or crystalline silicon, where the amorphous silicon may be hydrogenated amorphous silicon. As shown in FIG. 6, the basic structure 11 includes a metal cathode layer 111, a hole transport layer 112, an organic molecule layer 113, an electron transport layer 114, a transparent anode layer 115 and a substrate layer 116 that are stacked in sequence. Where, a material of the transparent anode layer 115 may be ITO (Indium Tin Oxides), a material of the substrate layer 116 may be glass; a side of the metal cathode layer 111 away from the hole transport layer 112 is adhered to the micro or nano sized structure 12.

A conventional OLED (Organic Light-Emitting Diode) pixel unit is improved in the present embodiment, specifically, a body of the conventional OLED pixel unit serves as a basic structure 11 of the present embodiment, additionally, a micro or nano sized structure 12 is attached to a back-lighting side of the basic structure 11, thereby obtaining a sub-pixel 1 being capable of imaging and projecting speckles.

Referring to FIG. 6, a lower side of the basic structure 11 is a back-lighting side of the basic structure 11, and an upper side of the basic structure 11 is a light-emitting side of the basic structure 11, that is, in the basic structure 11 shown in FIG. 6 (as in the body of the conventional OLED pixel unit), the metal cathode layer 111, the hole transport layer 112, the organic molecule layer 113, the electron transport layer 114, the transparent anode layer 115 and the substrate layer 116 are stacked in sequence from bottom to top. Specifically, a process of emitting imaging light from the basic structure 11 is described as follows. Driven by an external voltage, electrons from the metal cathode layer 111 and holes from the transparent anode layer 115 respectively move to the electron transport layer 114 and the hole transport layer 112 of the basic structure 11. Then, the electrons in the electron transport layer 114 and the holes in the hole transport layer 112 respectively move to the organic molecule layer 113 (also be termed as a light-emitting organic molecule layer) of the basic structure 11 for accumulation. When the electrons and the holes in the organic molecule layer 113 accumulate to a certain number, the electrons and the holes recombine, which results in the generation of excitons in the organic molecule layer 113 and then the organic molecules in the organic molecule layer 113 are activated, consequently, outermost electrons of the organic molecules are promoted from a ground state to an excited state. However, electrons in the excited state are extremely unstable and soon return to the ground states, during such return, energy will be released in the form of light, allowing the basic structure 11 to emit imaging light towards the light-emitting side of the basic structure 11 for display.

Figure 7:
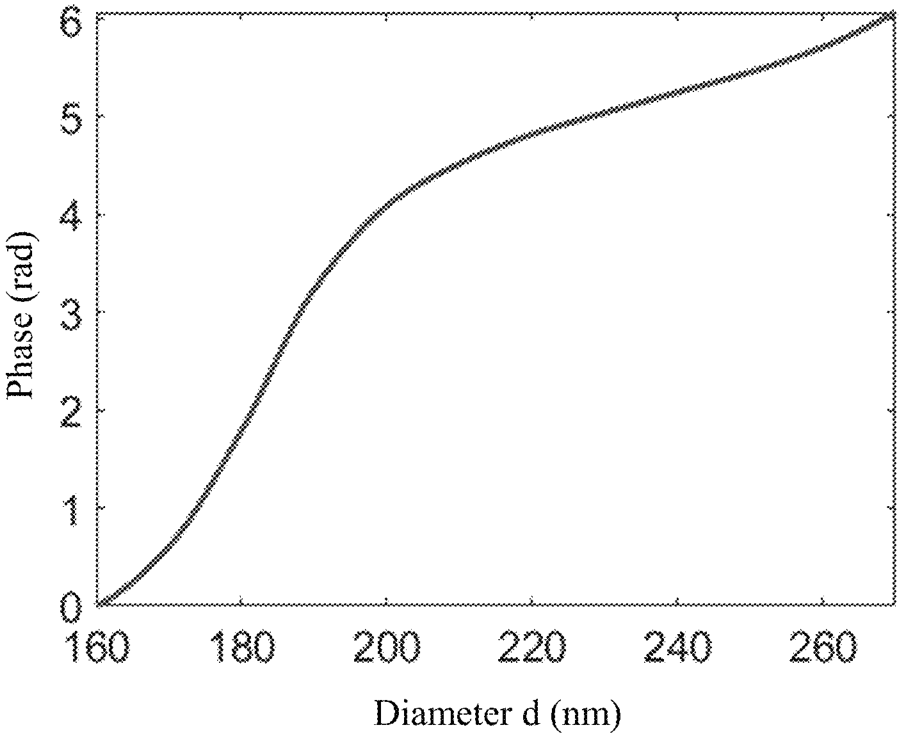
FIG. 7 shows a schematic diagram of a phase of a silicon nanopillar in the display screen as a function of a diameter d of a silicon nanopillar.

In the case that a wavelength of the incident light is 940 nm (as shown in FIG. 5, a wavelength of light emitted by the light source L ranks among common emission wavelengths of VCSEL). FIG. 7 shows a phase of a silicon nanopillar in the display screen as a function of a diameter d of the silicon nanopillar, and the silicon nanopillar has a height of 590 nm, a period of 525 nm, a refractive index of 3.9 and there are no filler materials 13 surrounding the silicon nanopillar. As shown in FIG. 7, the silicon nanopillar realizes $0\sim2\pi$ phase coverage and has efficient phase modulation capability at the operating wavelength of 940 nm. Based on this, the silicon nanopillar may be used as the micro or nano sized structure 12 in the sub-pixel 1 and be combined with the basic structure 11 to obtain a sub-pixel 1 that is capable of projecting speckles. For example, by varying a height or a diameter of the micro or nano sized structure 12 attached to a lower surface of the metal cathode layer 111, the phase of the incident light is efficiently modulated.

Figure 8:
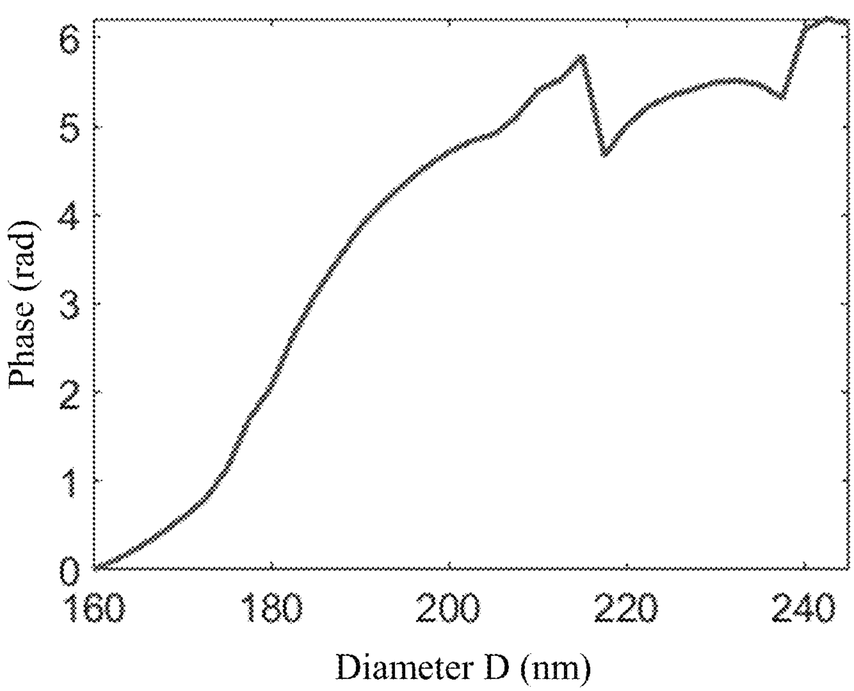
FIG. 8 is a schematic diagram showing a relationship between a diameter D of a sub-pixel and a modulation phase of the sub-pixel in a display screen according to an embodiment of the present disclosure.

FIG. 8 depicts a curve graph showing a relationship between a modulation phase and a diameter D of the sub-pixel 1. It should be noted that, the present embodiment may set a diameter of the micro or nano sized structure 12 to be equal to diameters of the metal cathode layer 111, the hole transport layer 112, the organic molecule layer 113, the electron transport layer 114 and the transparent anode layer 115 in the sub-pixel 1, that is, the diameter of the micro-nano structure 12 acts as the diameter of the sub-pixel 1. Where, the phase distribution shown in FIG. 8 is obtained by simulation of a sub-pixel 1 with a period of 525 nm at an operating wavelength of 940 nm. Where, the micro or nano sized structure 12 has a height of 590 nm and a refractive index of 3.9. A material of the metal cathode layer 111 in the basic structure 11 is gold (a relative dielectric constant of gold at the operating wavelength of 940 nm is $-36.22+2.36i$), and a thickness of the metal cathode layer 111 is 100 nm. During the simulation, the hole transport layer 112, the organic molecular layer 113, the electron transport layer 114 and the transparent anode layer 115 are regarded as an integral structural layer, and the integral structural layer has an equivalent refractive index of 2.2, and a thickness of 200 nm. As shown in FIG. 8, the modulation phase of the sub-pixel 1 covers $0\sim2\pi$, meeting the phase modulation requirements. Therefore, in addition to the function of emitting imaging light for display, the sub-pixel 1 also projects the speckles.

The present embodiment uses the traditional OLED pixel unit as the basic structure 11 of the sub-pixel 1, on this basis, the micro or nano sized structure 12 is additionally provided on the traditional OLED pixel unit. By designing a relatively large difference between the refractive index of the basic structure 11 and the refractive index of the micro or nano sized structure 12, efficient modulation of light is achieved. Thus, in the present embodiment, a sub-pixel 1 having dual functions is obtained by modifying the existing OLED pixel unit, and on this basis, a display screen having dual functions is formed. The display screen obtained herein is simple in structure and is also cost-effective.

Figure 9:
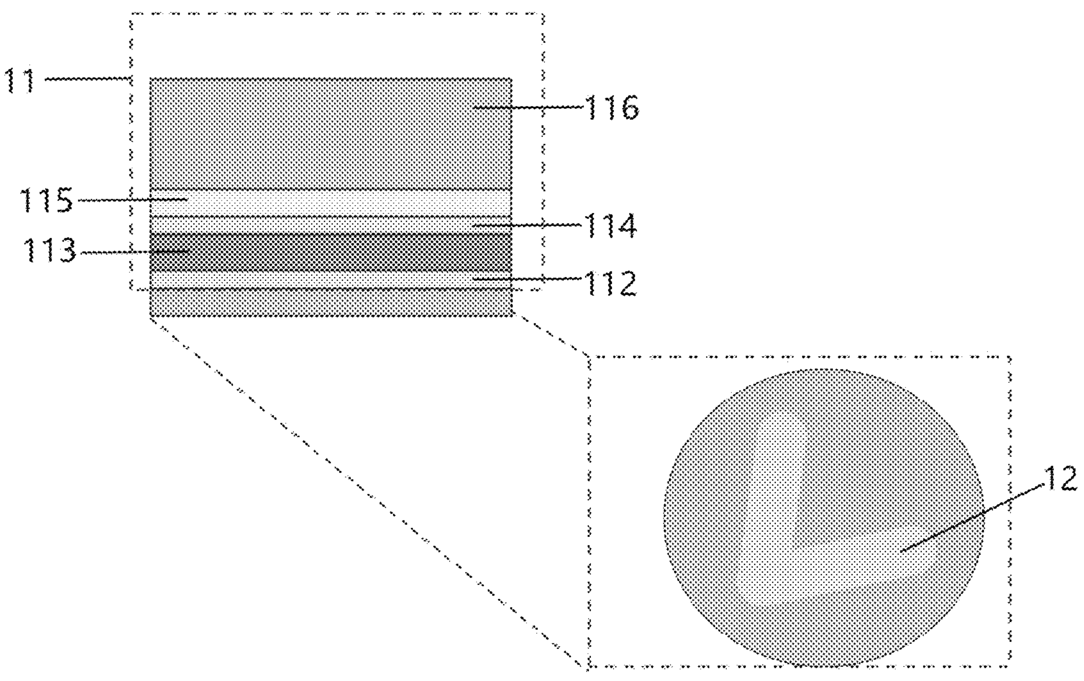
FIG. 9 schematically shows a specific structural diagram of a sub-pixel in a display screen according to an embodiment of the present disclosure.

Optionally, the micro or nano sized structure 12 is an antenna, and a material of the micro or nano sized structure 12 is a noble metal. Referring to FIG. 9, the basic structure 11 includes a hole transport layer 112, an organic molecule layer 113, and an electron transport layer 114, a transparent anode layer 115 and a substrate layer 116 that are stacked in sequence. A side of the hole transport layer 112 away from the organic molecule layer 113 is adhered to the micro or nano sized structure 12.

Another schematic structural diagram of a sub-pixel 1 is shown in FIG. 9. In the present embodiment, a metal cathode layer in the conventional OLED pixel unit is directly modified, for example, a hole transport layer 112, an organic molecule layer 113, an electron transport layer 114, a transparent anode layer 115 and a substrate layer 116 of the conventional OLED pixel unit are designed to serve as a basic structure 11 of the present embodiment. A back-lighting side (i.e., a lower side of the hole transport layer 112 as shown in FIG. 9) of the basic structure 11 is provided with a micro or nano sized structure 12, and the micro or nano sized structure 12 may be a noble metal antenna, for example, an antenna made of gold or silver. Moreover, in order to support the basic structure 11 above the micro or nano sized structure 12, empty spaces outside the antenna made of the noble metal may be filled with the filler materials 13, so that the micro or nano sized structure 12 is capable of serving as a conductive electrode for applying driving voltage (for example, serving as a metal cathode layer), and is also capable of serving as a phase modulation structure which responds to light, thereby enabling the sub-pixel 1 in the present embodiment to have dual functions of imaging and projecting speckles. It should be noted that since the antenna is polarization-dependent, when the antenna is used as the micro or nano sized structure 12, the phase modulation of light by the sub-pixel 1 is polarization-dependent, in other words, the sub-pixel 1 responds to light emitted by a polarized light source. Therefore, in the use of the sub-pixel 1 mentioned herein, a light source being capable of emitting polarized light may be used, or a polarizing filter may be added at an out-light side of the light source to meet the usage requirements. For example, the polarized light may be linearly polarized light, and the added polarizing filter may be a linear polarizing filter.

Figure 10:
FIG. 10 is a schematic diagram of an antenna with a dual-arm structure in a display screen according to an embodiment of the present disclosure.
Figure 11:
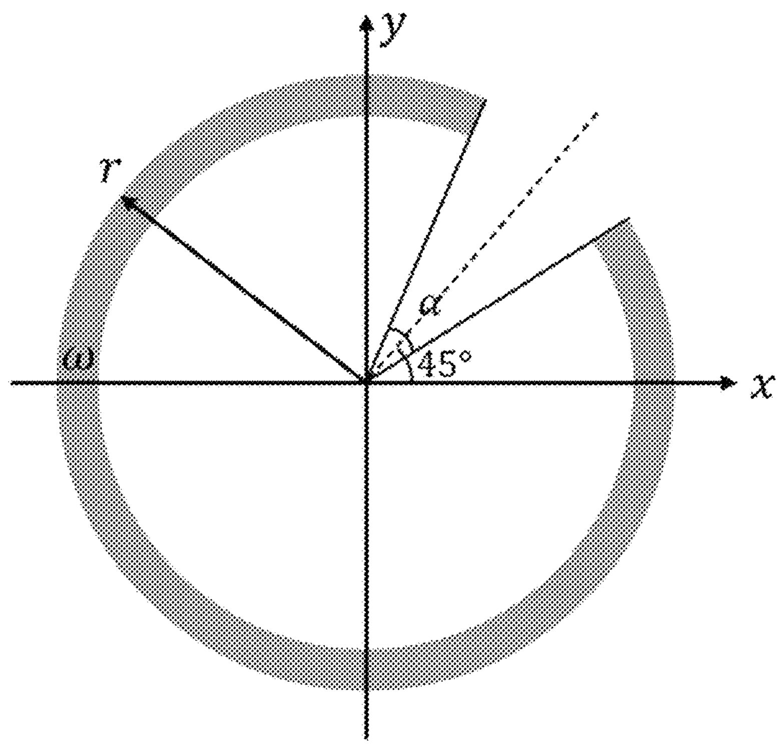
FIG. 11 is a schematic diagram of an antenna with a split ring structure in a display screen according to an embodiment of the present disclosure.

Optionally, as shown in FIG. 10 or FIG. 11, the micro or nano sized structure 12 includes a dual-arm structure, or a split ring structure. The dual-arm structure includes two straight arms connected at a common endpoint, and an included angle is formed by the two straight arms at the common endpoint. The included angle is greater than or equal to 60°, and less than or equal to 180°.

As shown in FIG. 10, when the micro or nano sized structure 12 is an antenna with a dual-arm structure, variation of an included angle between two arms alters a modulation phase of the micro or nano sized structure 12. FIG. 10 shows eight kinds of micro or nano sized structures 12 which sequentially modulate phases of $$0, \frac{\pi}{4}, \frac{\pi}{2}, \ldots, \frac{7\pi}{8}$$

in one cycle. A material of the antennas with the dual-arm structure shown in FIG. 10 is gold. An operating wavelength of the antennas is 9 μm. A thickness of each antenna is 50 nm. A length of each arm of each antenna is 20 nm. For four antennas on the left of FIG. 10, included angles formed by two arms are 60°, 90°, 120°, 180° from left to right. Four antennas on the right of FIG. 10 respectively correspond to the four antennas on the left of FIG. 10 and are obtained by rotating the four antennas on the left of FIG. 10 90° clockwise. Or, the micro or nano sized structure 12 may also be of a split ring structure as shown in FIG. 11. An antenna with a split ring structure is made of a noble metal and may also serve as a micro or nano sized structure 12 which is capable of modulating a phase of linearly polarized light, and details thereof will not be repeated herein.

Figure 12:
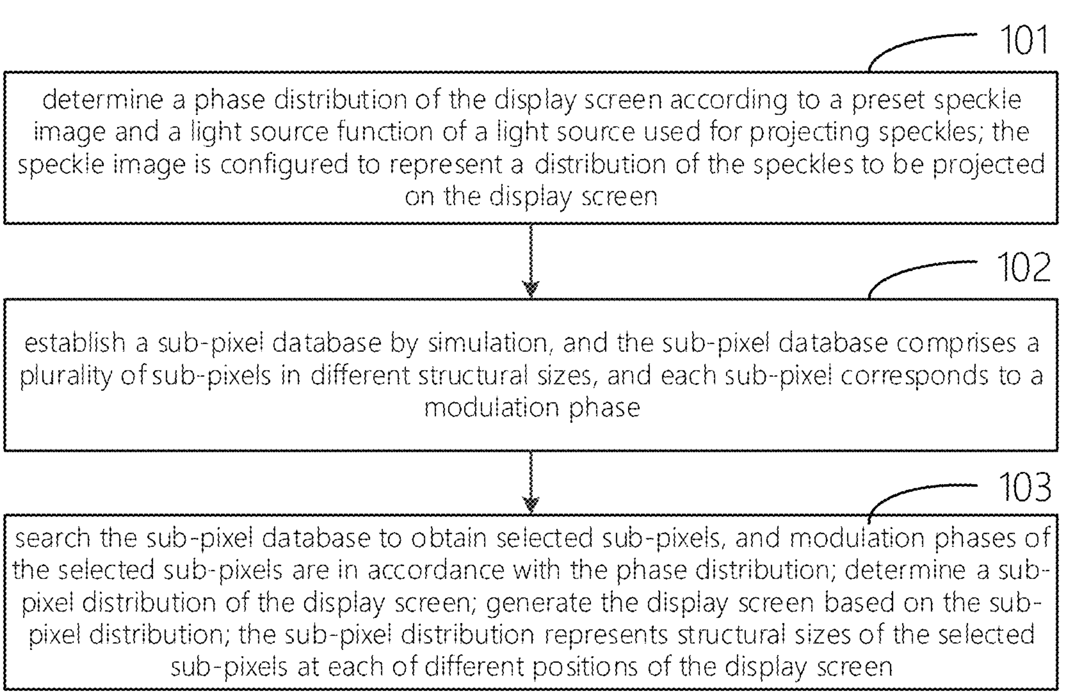
FIG. 12 is a flow chart of a method of designing a display screen according to an embodiment of the present disclosure.

In order to design any of the above display screens, a simulation software may be used in the present embodiment. Specifically, the display screen to be designed is simulated by the simulation software to obtain simulation results, and then the display screen is generated based on the simulation results. FIG. 12 shows a flow chart of a method of designing a display screen. The method includes the following steps 101-103, as shown in FIG. 12.

Step 101: Determining a phase distribution of the display screen according to a preset speckle image and a light source function of a light source for projecting speckles; the preset speckle image is configured to represent a distribution of the speckles to be projected on the display screen.

First, the preset speckle image is determined according to actual needs. Specifically, the preset speckle image may include points showing positions of the speckles. The number and the arrangement of the points in the preset speckle image clearly show the specific distribution (or effect) of the speckles to be projected on the display screen. For example, the preset speckle image may be a 3×3 image, that is, the preset speckle image includes nine points. The nine points are arranged in a 3×3 array. Based on the selection of an actual light source (i.e., a light source that projects light onto the display screen to be designed for generating speckles) and according to the preset speckle image and the light source function of the light source, it is calculated by algorithm to obtain the phase distribution of the display screen to be designed. Optionally, step 101 may include the use of a G-S algorithm (Gerchberg-Saxton algorithm) or an iterative Fourier transform algorithm to determine the phase distribution of the display screen, which will not be described in detail here.

Step 102: establishing a sub-pixel database through simulation. The sub-pixel database includes multiple sub-pixels of different structural sizes, and each sub-pixel corresponds to a modulation phase.

In the present embodiment, a sub-pixel database including a plurality of sub-pixels of different structural sizes may be obtained through simulation, where, each sub-pixel in the sub-pixel database corresponds to a certain modulation phase. And the plurality of sub-pixels correspond to different modulation phases, so that modulation phases of the sub-pixels in the sub-pixel database cover a range of 0 to 2π.

It should be noted that, in general, when a sub-pixel varies in structural size, the modulation phase of the sub-pixel changes accordingly. That is, modulation phases of the sub-pixels of each structural size may be different from each other. Each sub-pixel may cause different phase modulation effects on the same incident light. However, since a period of a modulation phase is 2π, some sub-pixels with different structural sizes may correspond to the same modulation phase, that is, these sub-pixels with different structural sizes may cause the same phase modulation effect on the same incident light. The present embodiment is not limited thereto.

Specifically, parameters including operating wavelengths, material parameters and transmittance parameters are determined, then, the parameters are scanned in the simulation software to obtain a corresponding relation between sub-pixels of different structural sizes and numerical values of modulation phases, so as to attain a sub-pixel database with discrete phase points.

Step 103: searching the sub-pixel database to obtain selected sub-pixels, and modulation phases of the selected sub-pixels are in accordance with the phase distribution, determining a sub-pixel distribution of the display screen, generating the display screen based on the sub-pixel distribution; the sub-pixel distribution represents structural sizes of the selected sub-pixels at different positions of the display screen.

After obtaining the phase distribution of the display screen to be designed according to step 101 and obtaining the sub-pixel database in step 102, the sub-pixels arranged at various positions on a surface of the display screen to be designed are determined in the present embodiment, that is, a distribution of sub-pixels in the display screen is determined. In other words, the distribution of sub-pixels in the display screen is structural sizes of sub-pixels which correspond to respective discrete phase points on the surface of the display screen and which is also the simulation results of the display screen. Therefore, in the present embodiment, some sub-pixels are selected from the sub-pixel database, modulation phases of the selected sub-pixels are in one-to-one correspondence with modulation phases of respective positions in the phase distribution. According to the arrangement in which respective sub-pixels are correspondingly located, simulation results (i.e., distribution of sub-pixels in the display screen) are obtained, such that, the display screen to be designed is generated based on the simulation results.

In the method of designing the display screen provided in the present embodiment, simply according to light source function of the selected light source and the preset speckle image, it is directly calculated by an algorithm (such as the G-S algorithm) to obtain the modulation phases of the sub-pixels that are distributed on the surface of the display screen to be designed, such that the phase distribution of the display screen is obtained. In addition, the method provided herein enables the establishment of a sub-pixel database, which associates the sub-pixels of different structural sizes with the modulation phases thereof. With the search in the sub-pixel database, appropriate sub-pixels are directly found, and then, the display screen is finally generated. Through the method provided herein, the phase distribution of the display screen is determined more concisely and clearly, and a display screen that projects incident light as speckles and displays images is quickly and accurately generated.

Optionally, in the case that pixels in the display screen to be designed include three kinds of sub-pixels displaying three different colors, and each kind of sub-pixels is configured to display a first color, a second color or a third color, the step of establishing the sub-pixel database by the simulation may include the following steps of A1-A2.

Step A1: organic molecules of sub-pixels of each structural size are imparted with all of a first refractive index that displays a first color, a second refractive index that displays a second color, and a third refractive index that displays a third color.

In the present embodiment, organic molecules with different colors may cause the basic structure 11 in the sub-pixel to emit imaging light of different colors for display, and certain differences exist among the refractive indices of different organic molecules. If the display screen to be designed is a color display screen, for example, the display screen displays three different colors, and the three different colors may be a first color, a second color and a third color, then, when establishing the sub-pixel database through simulation, it is necessary to consider refractive indices of the organic molecules displaying the first color, the second color and the third color, respectively. In the following description, sub-pixels of a certain structural size will be taken as an example to specifically explain how a sub-pixel database is constructed. Where, for organic molecules in the sub-pixels of the certain structural size (such as organic molecules in the basic structures), all of a first refractive index displaying a first color, a second refractive index displaying a second color and a third refractive index displaying a third color are assigned to the organic molecules of the sub-pixels of the certain structural size, so that the sub-pixels of the certain structural size are subsequently simulated according to the first refractive index, the second refractive index and the third refractive index.

Step A2: simulating sub-pixels of each structural size to obtain three different modulation phases, so as to form a sub-pixel database. Each of the three different modulation phases is a modulation phase of a sub-pixel with organic molecules having different refractive indices.

The sub-pixels of the certain structural size are simulated based on the first refractive index, the second refractive index and the third refractive index, so as to obtain first sub-pixels of the same structural size having a first modulation phase, second sub-pixels of the same structural size having a second modulation phase and third sub-pixels of the same structural size having a third modulation phase. Where, all of the first sub-pixels, the second sub-pixels and the third sub-pixels are capable of modulating the incident light into speckles, and any of the first sub-pixels, the second sub-pixels and the third sub-pixels are capable of projecting imaging light with one of three different colors (such as the first color, the second color or the third color) towards the light-emitting sides of respective sub-pixels. It can be understood that the reason why sub-pixels of the same structural size having three different modulation phases project imaging light with different colors is that respective modulation phases are obtained by simulating sub-pixels with organic molecules thereof being assigned with three different refractive indices. The present embodiment may adopt the same means to iterate over all sub-pixels of respective structural sizes, thereby obtaining multiple sub-pixels to constitute a sub-pixel database, and the sub-pixels of each structural size correspond to three different modulation phases. Each modulation phase enables the sub-pixel to project imaging light of the corresponding color.

In the process of constructing the sub-pixel database, colors of the imaging light to be projected are directly taken into consideration. For example, during the simulation, refractive indices of organic molecules displaying different colors are plugged into the calculation, so that sub-pixels of each structural size in the sub-pixel database have three different modulation phases, and each modulation phase corresponds to one color. By this method, sub-pixels that meet imaging requirements (such as color display requirements) can be directly selected in the subsequent process of selecting sub-pixels with the corresponding modulation phases from the sub-pixel database. The entire simulation process is simple, and sub-pixels in the generated sub-pixel database are also abundant, and the calculated modulation phases of the sub-pixels are more accurate.

Optionally, in the case that a pixel in the display screen to be designed includes three sub-pixels each displaying the first color, the second color or the third color, the step of establishing the sub-pixel database through simulation may include the following steps of B1-B2.

Step B1: averaging refractive indices of organic molecules displaying three different colors, so as to obtain an average value, and assigning the average value to refractive indices of organic molecules of each sub-pixel.

In the present embodiment, although there is a certain difference among refractive indices of organic molecules displaying different colors, the certain difference is relatively small. In order to simplify the simulation process, reduce the required computing power, and quickly build a sub-pixel database, there is no need to consider colors displayed by the sub-pixel during simulation. For example, the colors displayed by sub-pixels are regarded as the same color. The specific steps are described as follows. Refractive indices of organic molecules displaying different colors are unified, for example, refractive indices of organic molecules displaying three different colors are averaged to obtain an average value, and the average value is assigned to refractive indices of organic molecules of each sub-pixel (it is noted that sub-pixels vary in structural size), and then on this basis, simulation is performed.

Step B2: performing simulation to obtain a plurality of modulation phases of sub-pixels having organic molecules with a same refractive index, so as to form a sub-pixel database.

The use of the simulation software enables the acquisition of modulation phases of sub-pixels displaying the same color but have different structural sizes. The modulation phases of the sub-pixels are obtained according to the simulation of the sub-pixels of organic molecules which are given the same refractive index. In the present embodiment, the sub-pixels of different structural sizes and the corresponding modulation phases thereof constitute a sub-pixel database. Organic molecules of all sub-pixels in the sub-pixel database are used to display the same color.

Optionally, after steps of searching the sub-pixel database to obtain selected sub-pixels and determining the sub-pixel distribution of the display screen, the method further includes: assigning organic molecules displaying different colors to respective kinds of sub-pixels in each pixel.

In the sub-pixel database obtained by the simulation according to steps B1-B2, the refractive indices of the organic molecules that display different colors are not taken into account, thus, after determining the sub-pixel distribution of the display screen, or before generating the display screen based on the distribution, it is necessary to assign colors to be displayed (such as a first color, a second color and a third color) to sub-pixels at each of different positions in the display screen. A method of assigning colors is described as follows. Three different colors are assigned to multiple sub-pixels required to form a pixel, as shown in FIG. 1, if a pixel includes four sub-pixels, the four sub-pixels may be respectively assigned with organic molecules displaying a first color, a second color or a third color. Where, two sub-pixels may be assigned with same organic molecules displaying one color, so that pixels in FIG. 1 also emit imaging light with three different colors for display. Or, as shown in FIG. 3, if a pixel includes three sub-pixels (three adjacent sub-pixels), the three sub-pixels are respectively assigned with organic molecules displaying a first color, a second color or a third color, such that the pixel in FIG. 3 may emit imaging light with three different colors. The three sub-pixels mentioned herein are located at vertices of an equilateral triangle in space. Adjacent pixels are arranged in an equilateral triangle with vertices thereof staggered with each other. It should be noted that the arrangement of multiple sub-pixels in the same pixel may be random, or, to improve the uniformity of color rendering, the arrangement as shown in FIG. 3 may be selected, in this arrangement, sub-pixels displaying the same color are not adjacent to each other. The present embodiment is not limited thereto.

The method of designing the display screen of the present disclosure is described set forth in detail, and the method may be implemented by the corresponding devices. A device for designing a display screen of the present embodiment will be described in detail below.

Figure 13:
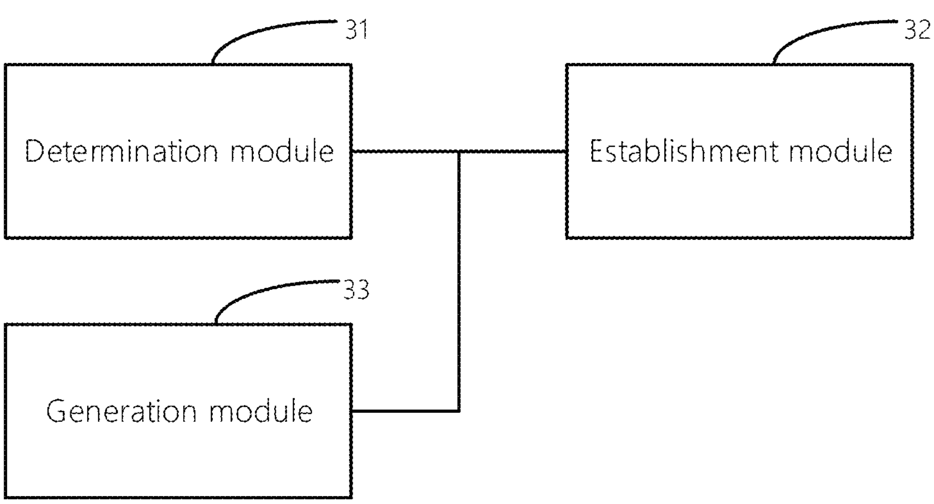
FIG. 13 schematically shows a structural diagram of a device for designing a display screen according to an embodiment of the present disclosure.

FIG. 13 schematically shows a device for designing a display screen according to an embodiment of the present disclosure. As shown in FIG. 13, the device for designing the display screen includes a processor. The processor includes a determination module 31, an establishment module 32 and a generation module 33.

The determination module 31 is configured to determine a phase distribution of the display screen according to a preset speckle image and a light source function of a light source used for projecting speckles. The preset speckle image is configured to represent a distribution of the speckles to be projected on the display screen.

The establishment module 32 is configured to establish a sub-pixel database by simulation, and the sub-pixel database includes a plurality of sub-pixels in different structural sizes, and each sub-pixel corresponds to a modulation phase.

The generation module 33 is configured to search the sub-pixel database to obtain selected sub-pixels, determine a sub-pixel distribution of the display screen, and generate the display screen based on the sub-pixel distribution. modulation phases of the selected sub-pixels are in accordance with the phase distribution. The sub-pixel distribution represents structural sizes of the selected sub-pixels at different positions of the display screen.

Optionally, the determination module 31 determines a phase distribution of the display screen by a G-S algorithm or an iterative Fourier transform algorithm.

Optionally, in the case that the pixels of the display screen to be designed include three kinds of sub-pixels each displaying a first color, a second color or a third color, the establishment module 32 includes a refractive index allocation unit and a first simulation unit.

The refractive index allocation unit is configured to impart all of a first refractive index of displaying the first color, a second refractive index of displaying the second color and a third refractive index of displaying the third color to organic molecules of the sub-pixels of each structural size.

The first simulation unit is configured to simulate the sub-pixels of each structural size to obtain three different modulation phases and generate the sub-pixel database; the three different modulation phases respectively correspond to the sub-pixels in which the organic molecules respectively have the first refractive index, the second refractive index or the third refractive index.

Optionally, in the case that the pixels of the display screen to be designed include three kinds of sub-pixels each displaying a first color, a second color or a third color. The establishment module 32 includes a refractive index averaging unit and a second simulation unit.

The refractive index averaging unit is configured to average refractive indices of organic molecules used to display three different colors, so as to obtain an average value; and is also configured to assign the average value to the refractive indices of the organic molecules of respective sub-pixels.

The second simulation unit is configured to perform simulation to obtain a plurality of modulation phases of the sub-pixels having organic molecules with a same refractive index, so as to form the sub-pixel database.

Optionally, the device for designing the display screen is configured to assign organic molecules that display different colors to respective kinds of sub-pixels in each pixel, after steps of searching the sub-pixel database to obtain selected sub-pixels and determining the sub-pixel distribution of the display screen.

By the device for designing the display screen provided in the present embodiment, simply according to the preset speckle image and light source function of the selected light source, it is directly calculated by an algorithm (such as the G-S algorithm) to obtain modulation phases of the sub-pixels that are distributed on the surface of the display screen to be designed, such that the phase distribution of the display screen is obtained. In addition, the device provided herein enables the establishment of a sub-pixel database, which associate sub-pixels of the different structural sizes with the corresponding modulation phases thereof. With the search in the sub-pixel database, appropriate sub-pixels are directly found, and then, the display screen is finally generated. Through the device provided herein, the phase distribution of the display screen is determined more concisely and clearly, and a display screen that projects incident light as speckles and displays images is quickly and accurately generated.

It should be noted that the device for designing the display screen implements the corresponding functions by functional modules as described above. However, the segmentation among the functional modules is only illustrative. In practical use, the above functions may be allocated to different functional modules as needed. That is, internal structures of the device are divided into different functional modules to complete all or a part of the functions described above. In addition, the device for designing the display screen and the method of designing the display screen in the embodiments as described above share the same concept. The specific implementation process of the device for designing the display screen is similar to the method of designing the display screen, and will not be repeated here.

According to one aspect of the present disclosure, a computer program product is provided. The computer program product includes a computer program including program code for executing a method shown in the flowchart. In an embodiment, the computer program may be downloaded from network via communications and may be installed. The computer program is executed by the processor to execute the method of designing the display screen provided by the present embodiment.

In addition, an electronic device is provided in the present embodiment. The electronic device includes a processor and a memory. A computer program is stored in the memory. The processor is capable of executing the computer program. The computer program is executed by the processor to implement the method of designing the display screen provided in any of the above embodiments.

Figure 14:
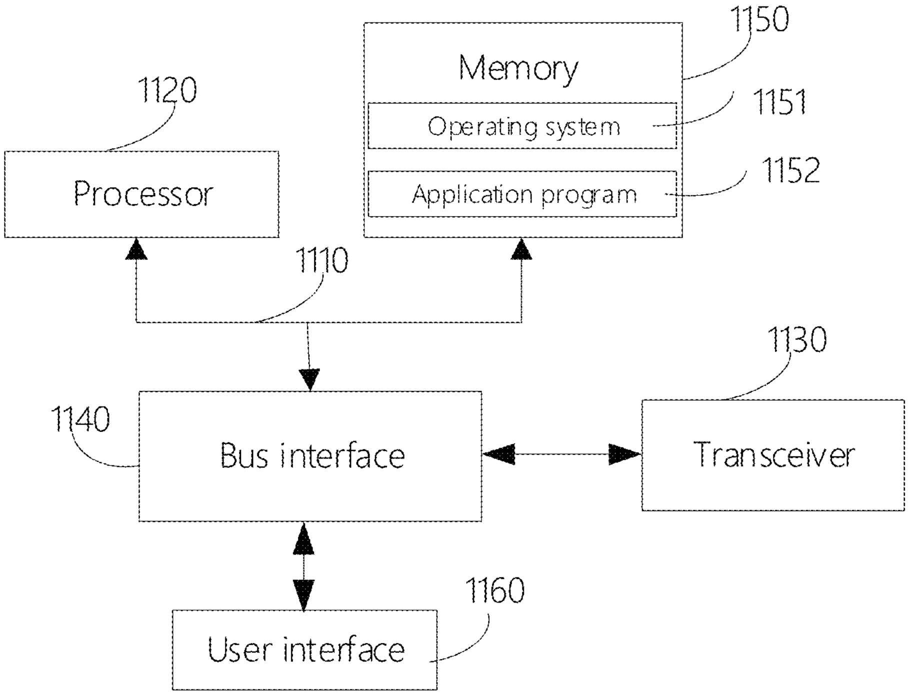
FIG. 14 schematically shows a structural diagram of an electronic device configured to perform a method of designing a display screen according to an embodiment of the present disclosure.

For example, FIG. 14 shows an electronic device according to an embodiment of the present disclosure. The electronic device includes a bus 1110, a processor 1120, a transceiver 1130, a bus interface 1140, a memory 1150 and a user interface 1160.

In the present embodiment, the electronic device further includes a computer program. The computer program is stored in the memory 1150 and is executable on the processor 1120. The computer program is executed by the processor 1120 to implement respective steps of the method of designing the display screen as described above.

The transceiver 1130 is configured to receive and transmit data under the control of the processor 1120.

In the present embodiment, the bus 1110 represents a bus framework. The bus 1110 may include any number of interconnected buses and bridges. The bus 1110 is configured to connect various circuits of one or more processors represented by the processor 1120 and a memory represented by the memory 1150.

The bus 1110 represents one or more of any one of a plurality of types of bus structures. The bus 1110 includes a memory bus and a local bus of any structure in a memory controller, a peripheral bus, an Accelerate Graphical Port (AGP), a processor or an architecture using various buses. For the purpose of illustration rather than limitation, the architecture includes an Industry Standard Architecture (ISA) bus, a Micro Channel Architecture (MCA) bus, an Enhanced ISA (EISA) bus, a Video Electronics Standards Association (VESA) bus, a Peripheral Component Interconnect (PCI) bus.

The processor 1120 may be an integrated circuit chip with signal processing capabilities. During the implementation processes, respective steps of the method described in the above embodiments may be completed by instructions in the form of integrated logic circuits in hardware or software in the processor. The processor may be a general-purpose processor, a Central Processing Unit (CPU), a Network Processor (NP), a Digital Signal Processor (DSP), an Application Specific Integrated Circuit (ASIC), a Field Programmable Gate Array (FPGA), a Complex Programmable Logic Device (CPLD), a Programmable Logic Array (PLA), a Microcontroller Unit (MCU) or other equipment such as a programmable logic device, a discrete gate, a transistor logic device, a discrete hardware component, which are capable of implementing or executing the method, respective steps and logical block diagrams disclosed in the present embodiment. For example, the processor may be a single-core processor or a multi-core processor. The processor may be integrated into a single chip or located on multiple different chips.

The processor 1120 may be a microprocessor or any conventional processor. The steps of the method disclosed in the present embodiment may be directly executed by a hardware decoding processor, or may be executed by a combination of a hardware module and a software module in a decoding processor. The software module may be provided in a readable storage media including Random Access Memory (RAM), Flash Memory (Flash Memory), Read-Only Memory (ROM), Programmable Read-Only Memory (PROM), Erasable PROM (EPROM) and a register, which are known in the art. The readable storage medium is located in the memory. The processor reads information in the memory and completes the steps of the method in combination with the hardware of the processor.

The bus 1110 may also realize the circuit connection of other devices such as peripheral equipment, a voltage regulator or power management circuit. The bus interface 1140 provides an interface between the bus 1110 and the transceiver 1130, which are known in the art. The general knowledge will not be described herein.

The transceiver 1130 may be an element or may be multiple elements, such as multiple receivers and multiple transmitters. The transceiver 1130 is configured to serve as a unit for communicating with various other devices over a transmission medium. For example, the transceiver 1130 receives external data from other devices, and the transceiver 1130 is used to send the processed data by the processor 1120 to other devices. Depending on the type of the computer system, a user interface 1160 may also be provided. The user interface 1160 may be a touch screen, a physical keyboard, a monitor, a mouse, a speaker, a microphone, a trackball, a joystick or a stylus.

It should be understood that in the present embodiment, the memory 1150 may further include memories remotely located relative to the processor 1120. The memories may be connected to a server through a network. One or more parts of the network may be an ad hoc network, an intranet, an extranet, a virtual private network (VPN), a local area network (LAN), a wireless local area network (WLAN), a wide area network (WAN), a wireless wide area network (WWAN), a metropolitan area network (MAN), Internet, a public switched telephone network (PSTN), a plain old telephone service (POTS) network, a cellular telephone network, a wireless network, a wireless fidelity (Wi-Fi) network or a combination thereof. The combination includes at least two kinds of networks listed herein. For example, the cellular telephone network and the wireless network may be a Global System for Mobile Communications (GSM), Code Division Multiple Access (CDMA), Worldwide Interoperability for Microwave Access (WiMAX), General Packet Radio Service (GPRS), a Broadband CDMA (WCDMA) system, a Long Term Evolution (LTE) system, an LTE Frequency Division Duplex (FDD) system, an LTE Time Division Duplex (TDD) system, a Long Term Evolution Advanced (LTE-A) system, a Universal Mobile Telecommunications (UMTS) system, an Enhanced Mobile Broadband (eMBB) system, a massive Machine Type of Communication (mMTC) system, an Ultra Reliable Low Latency Communications (uRLLC) system, etc.

It should be understood that the memory 1150 in the present embodiment may be a volatile memory, a non-volatile memory, or a combination thereof. Where, the non-volatile memory may be a Read-Only Memory (ROM), a Programmable ROM (PROM), and an Erasable PROM (EPROM), an Electrically EPROM (EEPROM) or a Flash Memory.

The Volatile memory may be a Random Access Memory (RAM), which is used as an external cache. The RAM may be of various types. For the purpose of illustration but not limitation, the RAM may be a Static RAM (SRAM), a Dynamic RAM (DRAM), a Synchronous DRAM (SDRAM), a Double Data Rate SDRAM (DDRSDRAM), an Enhanced SDRAM (ESDRAM), a synchronous link DRAM (SLDRAM) or a Direct Rambus RAM (DRRAM). The memory 1150 described in the present embodiment may be any of memories listed herein or may be any of other appropriate memories, and the present embodiment is not limited thereto.

In the present embodiment, the memory 1150 stores the following elements of an operating system 1151 and an application program 1152, including an executable module and a data structure, a subset of the operating system 1151 and the application program 1152 or an extended set of the operating system 1151 and the application program 1152.

Specifically, the operating system 1151 includes a variety of system programs including a framework layer, a core library layer and a driver layer, which are used to implement various basic services and process hardware-based tasks. The application program 1152 includes a variety of application programs including a Media Player and a Browser, which are used to implement various application services. Programs of implementing the method of the embodiments of the present disclosure may be included in the application program 1152. The application program 1152 includes applets, objects, components, logic, data structures, and other computer-executable instructions that perform specific tasks or implement specific abstract data types.

In addition, the present embodiment also provides a computer-readable storage medium in which a computer program is stored. The computer program is executed by a processor, such that respective steps of the method of designing the display screen are implemented and the same technical effect is achieved. Further details will not be discussed here for the purpose of avoiding repetition.

The computer-readable storage medium includes a media that is permanent (non-transitory), non-permanent, removable or non-removable. The media is a tangible device being capable of reserving and storing instructions which are usable to an instruction execution device. The computer-readable storage medium may be an electronic storage device, a magnetic storage device, an optical storage device, an electromagnetic storage device, a semiconductor storage device, or a combination thereof. The computer-readable storage medium includes a phase-change random access memory (PRAM), a static random access memory (SRAM), a dynamic random access memory (DRAM), other types of random access memory (RAM), a read only memory (ROM), a Non-volatile random access memory (NVRAM), an electrically erasable programmable read-only memory (EEPROM), a flash memory or other memory techniques, a compact disc read-only memory (CD-ROM), a digital versatile disc (DVD) or other optical storage devices, a magnetic cassette storage device, a tape disk storage device or other magnetic storage devices, a memory stick, a mechanical encoding device (such as punched cards or raised structures in grooves in which instructions are recorded) or any other Non-transmission media, which are used to store information that is accessible by a computing device. According to the definition in the present embodiment, the computer-readable storage medium does not include a transient signal itself. The transient signal may be, for example, radio waves or other freely propagating electromagnetic waves, electromagnetic waves propagating through waveguides or other transmission media (such as light pulses passing through fiber optic cables) or an electrical signal transmitted through a wire.

It should be understood that the device, the equipment and the method provided in the embodiments of the present disclosure may be implemented in other ways. For example, the device described above are only illustrative. Taking the modules or the units as an example, the division of modules or the units is performed according to logical functions. In actual implementation, there may be other division methods, for example, multiple units or multiple components may be combined or integrated into another system. Or, some features are ignored, or are not implemented. In addition, indirect coupling or direct coupling or communication connection as shown or as discussed may be realized by some interfaces, devices or units, or may be realized through electrical connection, mechanical connection, or connection in other forms.

The units described as separate components may or may not be physically separated. The components in the form of units may or may not be physical units, which may be located at one location or may be distributed to multiple network units. Some or all of the units may be selected according to actual needs to solve problems in the embodiments of the present disclosure.

In addition, respective functional units in the embodiments of the present disclosure may be integrated into one processing unit, or may be physical existences that are independent, or two or more units may be integrated into one unit. The integrated unit may be implemented in the form of hardware or software functional units.

The integrated unit may be stored in a computer-readable storage medium when the integrated unit is implemented in the form of software functional units, and is sold or used as an independent product. Based on this understanding, core parts of technical solutions or parts of the technical solutions that contribute to the prior art, or all or a part of the technical solutions of the embodiments of the present disclosure may be embodied in the form of a computer software product. The computer software product is stored in a storage medium and the computer software product includes a plurality of instructions. The plurality of instructions are configured to cause a computer device to execute all or a part of steps of the method described in the embodiments of the present disclosure, where the computer device may be a personal computer, a server, a data center or other network devices. The storage medium may be any of aforementioned mediums being capable of storing program code.

According to descriptions of the embodiments of the present disclosure, those skilled in the art should know that the embodiments of the present disclosure may be implemented in the form of the method, the device, the equipment and the storage media. Therefore, the embodiments of the present disclosure may be implemented in the following forms: complete hardware, complete software, or a combination of hardware and software. Where, the complete software may be a firmware, a resident software or a microcode. Furthermore, in some embodiments, the present disclosure may also be implemented in the form of a computer program product in one or more computer-readable storage mediums, where, the one or more computer-readable storage mediums contain computer program code.

The above-mentioned computer-readable storage medium may be any combination of one or more computer-readable storage mediums. The computer-readable storage medium includes electrical, magnetic, optical, electromagnetic, infrared or semiconductor systems, devices or equipment, or any combination thereof. More specifically, the computer-readable storage medium may be a portable computer disk, a hard disk, a random access memory (RAM), a read-only memory (ROM), an erasable and programmable read-only memory (EPROM), a flash memory, an Optical fiber, a compact disk read-only memory (CD-ROM), an optical storage device, a magnetic storage device, or any combination thereof. In the embodiments of the present disclosure, a computer-readable storage medium may be any tangible medium in which a program is contained or stored. The program may be used by an instruction execution system, an instruction execution device, an instruction execution equipment or a combination thereof.

The computer program code included in the computer-readable storage medium may be transmitted by any appropriate medium, including wireless, wire, optical cables, radio frequency (RF), or any combination thereof.

Computer program code for performing steps of the embodiments of the present disclosure may be written in assembly instructions, instruction set architecture (ISA) instructions, machine instructions, machine-related instructions, microcode, firmware instructions, state setting data, integrated circuit configuration data, or in one or more programming languages or a combination thereof. The programming languages include object-oriented programming languages, such as Java, Smalltalk, and C++. The programming languages also include conventional procedural programming languages, such as C language or similar programming languages. The computer program code may execute on the user's computer entirely or partly, or may execute as a stand-alone software package, or may execute partially on the user's computer and partially on the remote computer, or may execute entirely on a remote computer or a remote server. In the case that the remote computer is involved, the remote computer may be connected to the user's computer or to an external computer over any kind of network, such as a local area network (LAN) and a wide area network (WAN).

In the embodiments of the present disclosure, the method, the device and the equipment are described through flow charts and/or block diagrams.

It should be understood that each block or any combination of the blocks in the flow charts and/or the block diagrams may be implemented by computer-readable program instructions. These computer-readable program instructions may be provided to a processor of a general-purpose computer, a special-purpose computer, or other programmable data processing apparatus to produce a machine. The computer-readable program instructions may be executed by the computer or other programmable data processing apparatus to produce a device which implements functions or operations specified by the blocks in the flow charts and/or the block diagrams.

The computer-readable program instructions may also be stored in a computer-readable storage medium that enables a computer or other programmable data processing apparatus to operate in a specific way. Such that, the computer-readable program instructions stored in the computer-readable storage medium produce a device including instructions to implement the functions or the operations specified by the blocks in the flow charts and/or the block diagrams.

Computer-readable program instructions may also be loaded onto a computer, other programmable data processing apparatus, or other devices, so that a series of operation steps are executed by the computer, the other programmable data processing apparatus, or the other devices, thereby producing a computer-implementable process. Thus, the instructions are executed on the computer or on the other programmable data processing apparatus, which enable the implementation of functions or operations specified by the blocks in the flow charts and/or the block diagrams.

The embodiments of the present disclosure mentioned above are illustrative, and are not intended to limit the present disclosure. The scope of the embodiments of the present disclosure is not limited thereto. All variations or substitutions that are easily thought of by those skilled in the art fall within the scope of the present disclosure. Accordingly, the scope of the present application is defined by the appended claims.

What is claimed is:

1. A display screen, comprising: a plurality of pixels periodically arranged, wherein:

each pixel comprises at least one sub-pixel, each sub-pixel is configured to display a color;

each sub-pixel comprises a basic structure and at least one micro or nano sized structure; the basic structure is configured to emit imaging light with the color for display;

the at least one micro or nano sized structure is provided on a back-lighting side of the basic structure, and is configured to project incident light into speckles and enable the speckles to pass through the basic structure; and a refractive index of the basic structure is different from a refractive index of the at least one micro or nano sized structure.

2. The display screen according to claim 1, wherein the refractive index of the basic structure is less than the refractive index of the at least one micro or nano sized structure, and an absolute value of a difference between the refractive index of the at least one micro or nano sized structure and the refractive index of the basic structure is greater than a preset threshold.

3. The display screen according to claim 1, wherein a material of the at least one micro or nano sized structure comprises silicon nitride, fused quartz, gallium nitride, amorphous silicon or crystalline silicon.

4. The display screen according to claim 3, wherein the basic structure comprises a metal cathode layer, a hole transport layer, an organic molecule layer, an electron transport layer, a transparent anode layer and a substrate layer which are stacked in sequence; a side of the metal cathode layer away from the hole transport layer is adhered to the at least one micro or nano sized structure.

5. The display screen according to claim 1, wherein the at least one micro or nano sized structure is an antenna, and a material of the at least one micro or nano sized structure comprises a noble metal.

6. The display screen according to claim 5, wherein the basic structure comprises a hole transport layer, an organic molecule layer, an electron transport layer, a transparent anode layer and a substrate layer which are stacked in sequence; a side of the hole transport layer away from the organic molecule layer is adhered to the at least one micro or nano sized structure.

7. The display screen according to claim 5, wherein the at least one micro or nano sized structure comprises a dual-arm structure;

the dual-arm structure comprises two straight arms connected at a common endpoint, and an included angle is formed by the two straight arms at the common endpoint.

8. The display screen according to claim 7, wherein the included angle is greater than or equal to 60°, and less than or equal to 180°.

9. The display screen according to claim 5, wherein the at least one micro or nano sized structure comprises a split ring structure.

10. The display screen according to claim 1, wherein each pixel comprises three kinds of sub-pixels configured to display three different colors, and each kind of sub-pixels displays a first color, a second color or a third color.

11. A method of designing the display screen according to claim 1, comprising:

determining a phase distribution of the display screen according to a preset speckle image and a light source function of a light source used for projecting the speckles; wherein the preset speckle image is configured to represent a distribution of the speckles to be projected on the display screen;

establishing a sub-pixel database by simulation, wherein the sub-pixel database comprises a plurality of sub-pixels in different structural sizes, and each sub-pixel corresponds to a modulation phase;

searching the sub-pixel database to obtain selected sub-pixels, wherein modulation phases of the selected sub-pixels are in accordance with the phase distribution; determining a sub-pixel distribution of the display screen; generating the display screen based on the sub-pixel distribution; wherein the sub-pixel distribution represents structural sizes of the selected sub-pixels at different positions.

12. The method according to claim 11, wherein a step of determining the phase distribution of the display screen according to the preset speckle image and the light source function of the light source used for projecting the speckles comprises:

determining the phase distribution of the display screen by a G-S algorithm or an iterative Fourier transform algorithm.

13. The method according to claim 11, wherein in a case that each pixel of the display screen to be designed comprises three kinds of sub-pixels each displaying a first color, a second color or a third color, a step of establishing the sub-pixel database by the simulation comprises:

imparting all of a first refractive index of displaying the first color, a second refractive index of displaying the second color and a third refractive index of displaying the third color to organic molecules of the sub-pixels of each structural size;

simulating the sub-pixels of each structural size to obtain three different modulation phases and generate the sub-pixel database; the three different modulation phases respectively correspond to the sub-pixels in which the organic molecules respectively have the first refractive index, the second refractive index and the third refractive index.

14. The method according to claim 11, wherein in a case that each pixel of the display screen to be designed comprises three kinds of sub-pixels each displaying a first color, a second color or a third color, a step of establishing the sub-pixel database by the simulation comprises:

averaging refractive indices of organic molecules used to display three different colors, so as to obtain an average value; assigning the average value to the refractive indices of the organic molecules of respective sub-pixels;

performing simulation to obtain a plurality of modulation phases corresponding to the sub-pixels having organic molecules with a same refractive index, so as to form the sub-pixel database.

15. The method according to claim 11, wherein, after searching the sub-pixel database to obtain the selected sub-pixels and determining the sub-pixel distribution of the display screen, the method further comprises:

assigning organic molecules that display different colors to respective kinds of sub-pixels in each pixel.

16. An electronic device, comprising:

a processor and a memory, the memory comprises a computer program stored in the memory, wherein the computer program is executed by the processor, so as to implement the method of claim 11.

17. A non-transitory computer-readable storage medium in which a computer program is stored, wherein the computer program is executed by a processor, so as to implement the method of claim 11.

* * * * *